United States Patent [19]

Herndon

[11] 4,032,902
[45] June 28, 1977

[54] SEMICONDUCTOR MEMORY CELL CIRCUIT AND STRUCTURE

[75] Inventor: William H. Herndon, Sunnyvale, Calif.

[73] Assignee: Fairchild Camera and Instrument Corporation, Mountain View, Calif.

[22] Filed: Oct. 30, 1975

[21] Appl. No.: 627,444

[52] U.S. Cl. .......................... 340/173 FF; 357/44
[51] Int. Cl.² ................................. G11C 11/44
[58] Field of Search ............... 340/173 FF, 173 R; 357/42, 44

[56] References Cited
UNITED STATES PATENTS

| | | | |
|---|---|---|---|
| 3,423,737 | 1/1969 | Harper | 340/173 FF |
| 3,643,235 | 2/1972 | Berger et al. | 340/173 FF |

Primary Examiner—Marshall M. Curtis
Attorney, Agent, or Firm—Alan H. MacPherson; Henry K. Woodward; Norman E. Reitz

[57] ABSTRACT

An improved memory cell comprising a word line, a pair of bit lines, a pair of load impedances, and a pair of switching transistors. The pair of switching transistors each include an emitter coupled to a respective one of the bit lines, a base coupled to a respective one of the load impedances, and a collector coupled to the base of the other switching transistor. The pair of load impedances may include a pair of transistors each having an emitter coupled to the word line, a base coupled to a respective one of the emitters of the pair of switching transistors, and a collector coupled to a respective one of the bases of the switching transistors.

9 Claims, 10 Drawing Figures

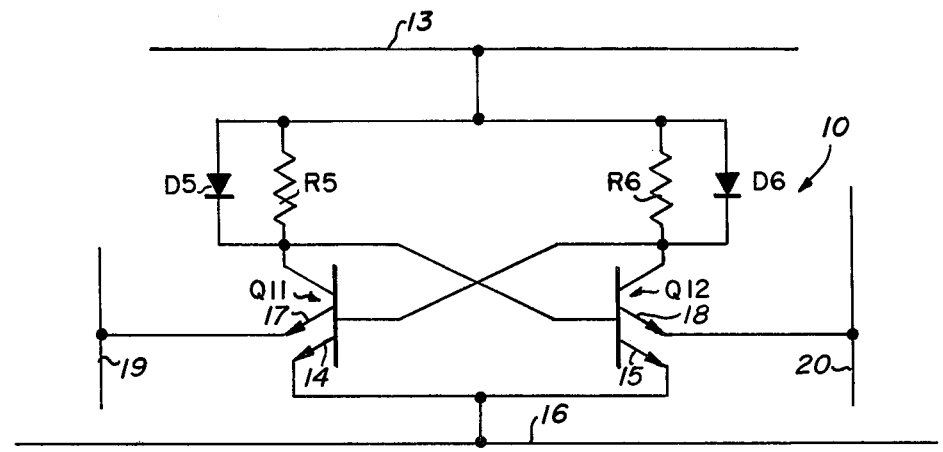
Fig_1 PRIOR ART
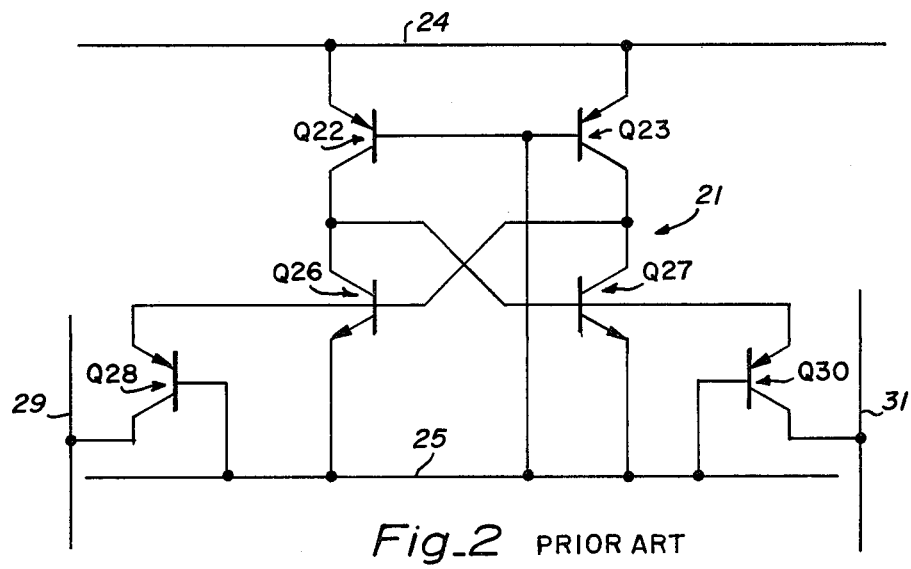
Fig_2 PRIOR ART
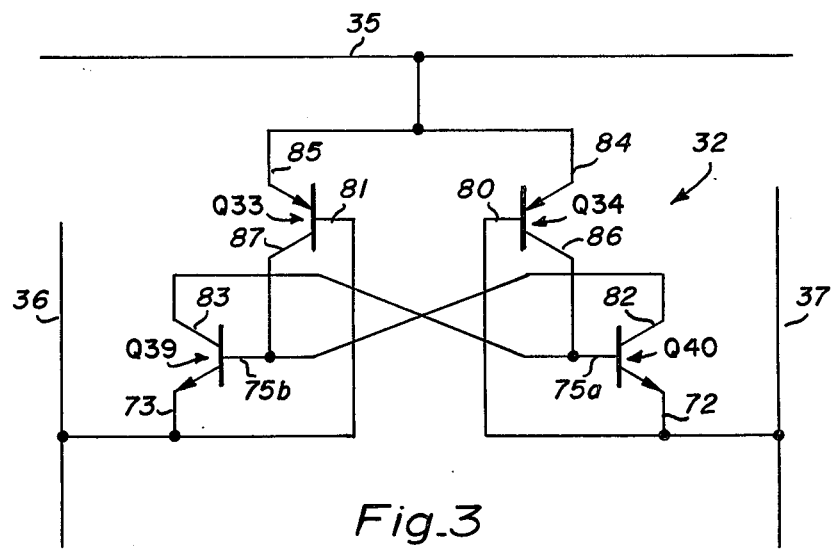
Fig_3

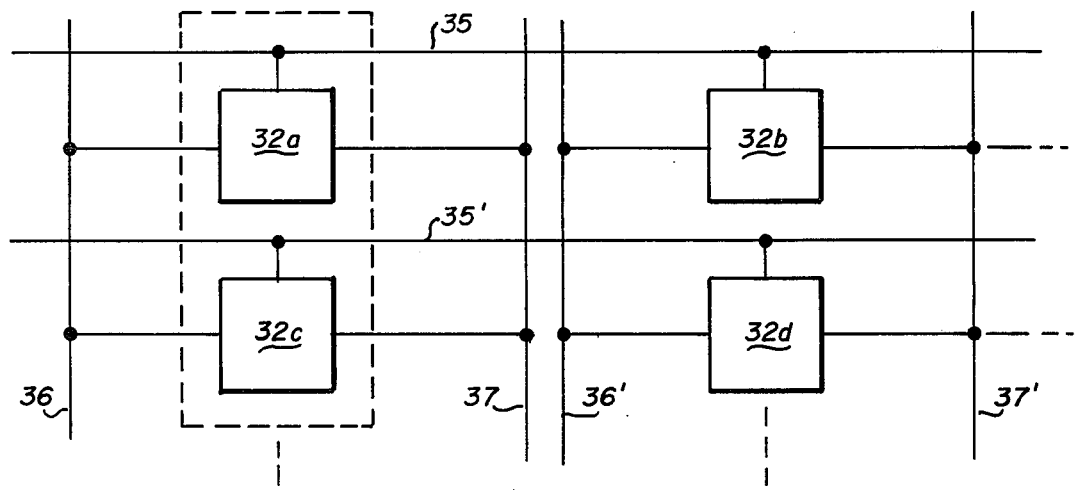
Fig_4
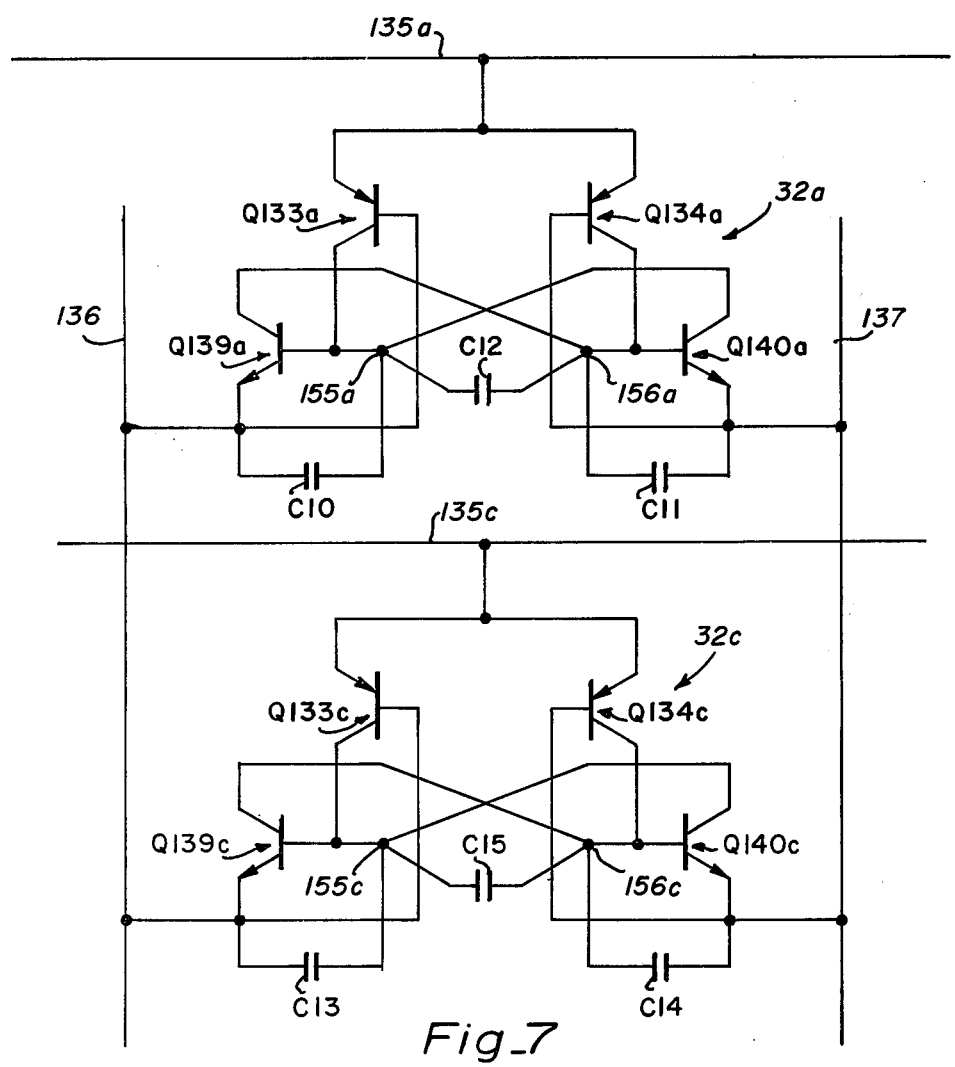
Fig_7

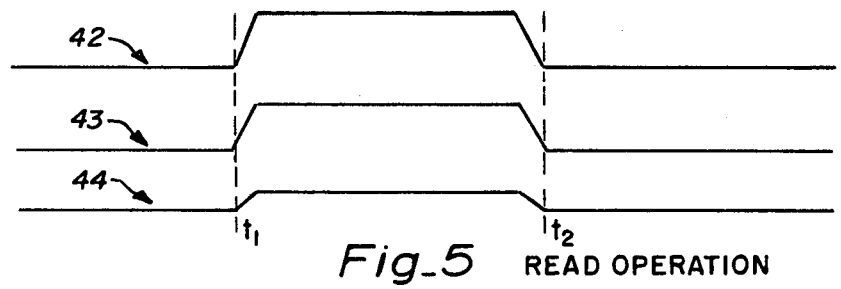
Fig_5 READ OPERATION
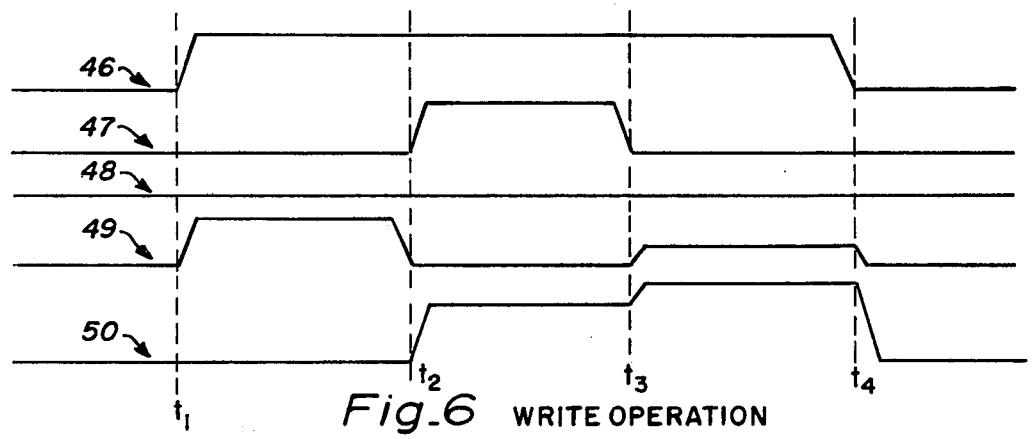
Fig_6 WRITE OPERATION
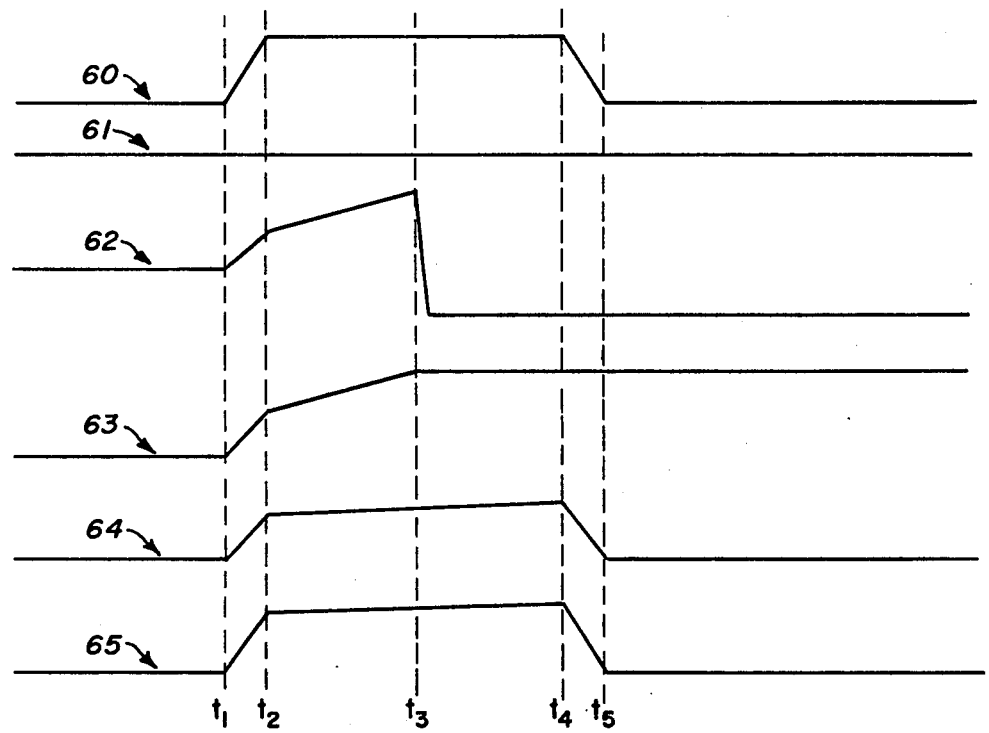
Fig_8

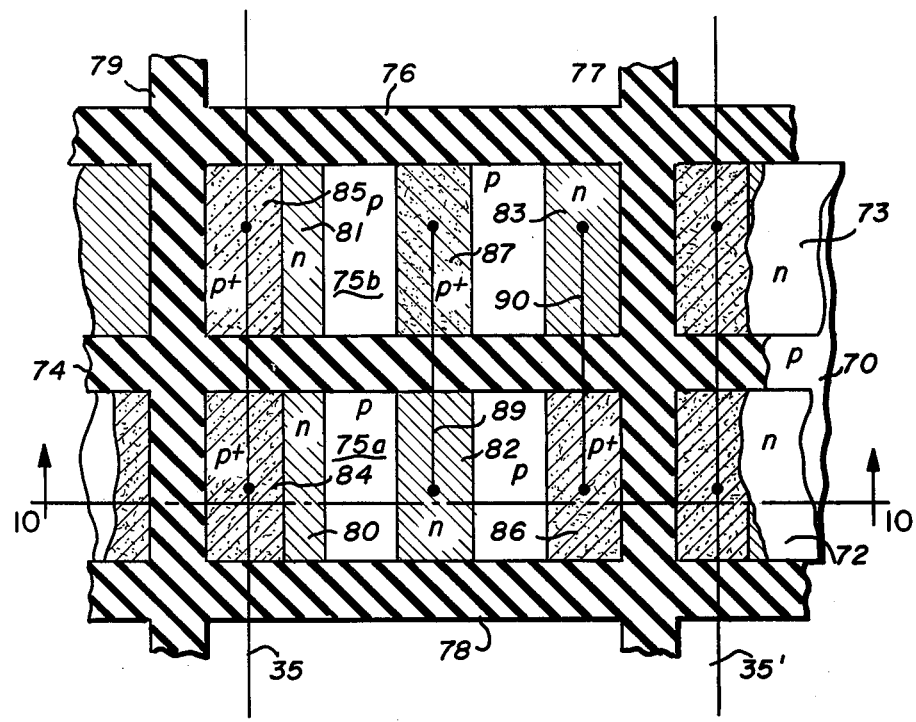
Fig_9
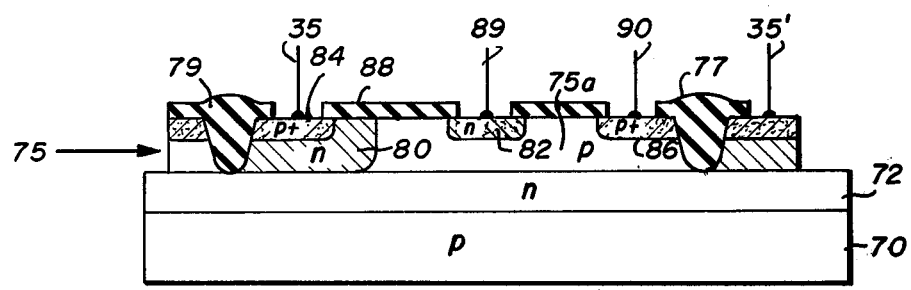
Fig_10

IMPROVED SEMICONDUCTOR MEMORY CELL CIRCUIT AND STRUCTURE

BACKGROUND OF THE INVENTION

1. Field of the Invention

This invention relates to memory storage devices or memory cells for use in Random Access Memories (RAM's), and more particularly to a memory cell of the so-called injection logic type integrated circuit including a bistable circuit having a pair of switching transistors.

2. Prior Art

The present invention is an improvement over the prior art monolithic memory cell as disclosed in U.S. Pat. No. 3,815,106 issued June 4, 1974, to Sigfried Kurt Wiedmann.

Prior art memory cells usually require that each cell in the memory array have two power connections, which connections may be shared with adjacent cells. If, for example, the power connections also are used for row addressing, such connections can only be shared with other cells of the same row. This requirement of additional power connections to the memory cells increases the complexity of a memory array including a mulplicity of such memory cells. Such a prior art device is disclosed in U.S. Pat. No. 3,886,531, issued May 27, 1975, to Jon L. McNeill. The prior art memory cells will be described in greater detail under the Detailed Description hereinbelow.

SUMMARY OF THE INVENTION

A new and improved memory cell is provided which comprises a word line, a pair of bit lines, a pair of load impedances, and a pair of switching transistors, each having an emitter coupled to a respective one of the bit lines, a base coupled to a respective one of the load impedances, and a collector coupled to the base of the other switching transistor.

An advantage of the circuit of this invention is that the bit lines, which couple the information in the cell to outside circuits, also provide power to the memory cell. Accordingly, less components and connections are required to construct memory cells in an array, which reduces the area of an integrated embodiment of this circuit and increases the number of cells that can be formed on a single integrated circuit chip.

BRIEF DESCRIPTION OF THE DRAWINGS

FIG. 1 is a schematic diagram of a typical prior art memory cell;

FIG. 2 is a schematic diagram of another piror art memory cell;

FIG. 3 is a schematic diagram of a memory cell in accordance with the present invention;

FIG. 4 is a schematic diagram showing an array of two rows and two columns of memory cells and the bit lines and word lines connected thereto;

FIG. 5 is a timing diagram of a typical read operation of the present invention;

FIG. 6 is a timing diagram of a typical write operation of the present invention;

FIG. 7 is a schematic diagram of two cells showing the same bit line with internal parasitic capacitances denoted for a detailed explanation of the write operation;

FIG. 8 shows the internal node voltages in a typical write operation;

FIG. 9 is a planar view of an integrated embodiment of the present invention; and FIG. 10 is a cross-sectional view of the integrated embodiment illustrated in FIG. 7.

DETAILED DESCRIPTION

Referring now to the drawings, and in particular to FIG. 1, a schematic diagram of a prior art memory cell 10 is illustrated. A pair of switching transistors Q11 and Q12 are cross-coupled to form the basic bistable circuit of the memory cell. That is, the base terminal of the transistor Q11 is coupled to the collector terminal of Q12, and the base terminal of the transistor Q12 is coupled to the collector terminal of the transistor Q11. The collector of the transistor Q11 is coupled to an address line 13 through a parallel combination of a resistor R5 and diode D5. In a similar manner, the collector terminal of the transistor Q12 is also coupled to the address line 13 through a parallel combination of a resistor R6 and diode D6. The cathodes of the diodes D5 and D6 are coupled to the collector terminals of the transistors Q11 and Q12, respectively. Each transistor Q11 and Q12 has a pair of emitters. First emitters 14 and 15 of the transistors Q11 and Q12, respectively, are coupled to a common address line 16. Second emitters 17 and 18 of the transistors Q11 and Q12 are coupled to bit lines 19 and 20, respectively.

The parallel combinations of the resistor R5 and diode D5, and resistor R6 and diode D6 form load impedances for the transistors Q11 and Q12, respectively. Power is supplied to the memory cell 10 by means of the line 13 with a power return line 16. Reading from and writing into the cell are accomplished by providing a raised voltage level on line 13. During the read operation the bias voltage on lines 19 and 20 is such that transistor Q11 or Q12 is turned ON depending on the state of the memory cell. During the write operation, the bit lines are biased to turn transistor Q11 or Q12 ON depending upon the information to be stored. Emitters 14 and 15 of the transistors Q11 and Q12 provide a power return current path by means of the line 16.

Referring now to FIG. 2, a schematic diagram of another prior art memory cell 21 is illustrated. A pair of load impedance transistors Q22 and Q23 each have an emitter terminal coupled to an address line 24. The base terminals of the transistors Q22 and Q23 are connected together and this connection is coupled to a second address line 25. The collector terminal of the transistor Q22 is coupled to the collector terminal of a first transistor Q26 of a pair of switching transistors, and is also coupled to the base terminal of a second transistor Q27 of the pair of switching transistors. In a similar manner, the collector terminal of the transistor Q23 is coupled to the collector terminal of the transistor Q27, and to the base terminal of the transistor Q26. The emitter terminals of the transistors Q26 and Q27 are each coupled to the address line 25. The base terminal of the transistor Q26 is coupled to the emitter terminal of an addressing transistor Q28, and the base terminal of the transistor Q28 is coupled to the address line 25. The collector terminal of the addressing transistor Q28 is coupled to a first bit line 29 of a pair of bit lines. The base terminal of the transistor Q27 is coupled to the emitter terminal of a second addressing transistor Q30, and the base terminal of the transistor Q30 is coupled to the address line 25. The collector terminal of the transistor Q30 is coupled to a second bit line 31 of the pair of bit lines. Greater detail of the prior art memory cell as shown in FIG. 2 is disclosed in U.S. Pat. No. 3,815,106.

Referring now to FIG. 3, a schematic diagram of memory cell 32 of the present invention is illustrated. A pair of load impedance transistors Q33 and Q34 each have an emitter terminal coupled to a word line 35. The base terminal of the transistor Q33 is coupled to a bit line 36, and the base terminal of the transistor Q34 is coupled to a bit line 37. The collector terminal of the transistor Q33 is coupled to the base terminal of a first switching transistor Q39 of a pair of switching transistors. The emitter terminal of the transistor Q39 is also coupled to the bit line 36. The collector terminal of the transistor Q39 is coupled to the base terminal of a transistor Q40. The base terminal of the transistor Q39 is coupled to the collector terminal of the transistor Q40, and the emitter terminal of the transistor Q40 is coupled to the bit line 37.

Transistor Q39 and Q40 form a standard cross-coupled flip-flop or bistable circuit. That is, in operation, if transistor Q39 is ON, it absorbs the collector current from transistor Q34, and pulls transistor Q40 into an OFF state. This condition, however, is accomplished so long as the voltages applied on the bit lines 36 and 37 are approximately equal and are of sufficiently low impedance such that these voltages are not primarily determined by the memory cell current. Transistors Q33 and Q34 act as current sources or impedance loads for the transistor Q39 and Q40, respectively. The base terminals of the transistors Q33 and Q34 are coupled to the bit lines 36 and 37, respectively, for topological convenience and to reduce the number of connections to the circuit, thereby resulting in a minimum layout area of the integrated embodiment of this circuit. It is noted that the base leads of the transistors Q33 and Q34 could also be connected to a sixth node (not shown) and circuit operation would not be thereby impaired.

During a read operation, the information stored in the memory cell 32 is read out of the cell by sensing the difference in currents on the bit lines 36 and 37. If, for example, transistor Q39 is in an ON state its emitter current is the sum of the collector currents from the transistors Q33 and Q34. The total current supplied on the bit line 36 is thus equal to the emitter current of Q39 and the base current of the transistor Q33. Thus, the current supplied on the bit line 37 is equal to only the base current from the transistor Q34.

Transistors Q33 and Q34 will each have substantially the same base-emitter voltage. Thus, the collector current from the transistors Q33 and Q34 are approximately equal, and the base currents of these transistors are also approximately equal. Therefore, the current supplied on the bit line 36 will exceed the current supplied on the bit line 37 by the collector currents of the transistors Q33 and Q34. During normal operation, a number of cells share the same bit lines. That is, the lines 36 and 37 are connected to other cells, and to the sense amplifier/bit driver circuits of the memory array. Accordingly, the bit lines 36 and 37 provide the power to the unaddressed as well as the addressed cells within the array. The information in the addressed cell is distinguished from information in the nonaddressed cells by forcing the load impedance transistors Q33 and Q34 in the addressed row of memory cells to a high-current state such that the currents in the addressed cell determine the current difference in the bit lines.

A write operation is accomplished by raising the potential of the ON side bit line relative to the potential on the word line 35.

For example, assume that transistor Q39 is in the ON state and it is desired to change the state of the cell such that the transistor Q40 is in an ON state. If the potential on the bit line 36 is raised relative to the potential on the word line 35 then transistors Q33 and Q39 will turn OFF. The collector current from the Q34 will then turn the transistor Q40 ON. Lowering the potential on the bit line 36 relative to the voltage on the word line 35 then turns ON transistor Q33, but transistor Q40 absorbs the collector current and holds transistor Q39 OFF.

Since several cells share the same bit lines, writing into the non-addressed cells is prevented by operating these non-addressed cells at a sufficiently low current such that the collector current of transistor Q34 is insufficient to turn transistor Q40 ON in the time allowed by the write pulse. Thus, this can place a restriction on the maximum width for a write pulse that can be used in such a memory system. The operation of the memory cell 32 illustrated in FIG. 3 will be more fully understood following a description of the array shown in FIG. 4 with the timing diagrams shown in FIGS. 5 and 6.

Referring now to FIG. 4, the array of memory cells is shown with connections to word lines 35, 35', ... bit lines 36, 36', ... and 37, 37' ..., etc. It is noted that the memory cells 32a, 32b, 32c, 32d ... comprise only a small portion of an array of such memory cells. Also, it is noted that each memory cell has only three connections which substantially simplifies the integrated circuit of the array including a multiplicity of such memory cells.

Referring now to FIG. 5, a timing diagram of the operation of a typical memory cell 32 is illustrated. Waveform 42 illustrates the voltage supplied on the word line 35 (or 35' ... ) to effect the read operation. Waveform 43 illustrates the change in current on the bit lines coupled to the ON-side of the cell 32 in response to the potential change on word line 35 (waveform 42). Waveform 44 illustrates the current supplied on the opposite bit line (i.e., the OFF-side). Note that between times $t_1$ and $t_2$ the magnitude of the current shown by waveform 43 exceeds the magnitude of the current shown by waveform 44. The magnitude of the waveform 44 is exaggerated for clarification of the drawing. In operation, current also flows out of the OFF side of the memory cell 32 during a read operation; however, this current is smaller than the current from the ON-side of the memory cell. Read circuitry (not shown) of the array can detect this current difference to decipher the state of the cell. In addition, current also flows out of the unaddressed cells in a particular column, but this current is much smaller since the voltage on the word line (e.g., line 35') is not raised as is the voltage on the word line 35. Thus, the current from the addressed memory cell dominates. Alternatively, a scheme may be provided to allow the power supplies to the unaddressed cells to be momentarily interrupted.

Referring now to FIG. 6, a timing diagram of the write operation of the memory cell 32 is illustrated. Waveform 46 illustrates the voltage supplied on the word line 35 (or 35' ... ) during the write operation. Waveform 47 illustrates the voltage supplied on a bit line during the write operation, for example, bit line 36.

Waveform 48 illustrates the voltage supplied to the opposite bit line, for example bit line 37 during a write operation. Waveform 49 illustrates the current supplied from the non-write side of the memory cell during the write operation. Waveform 50 illustrates the current obn the write-side bit line of the memory cell 32 during the write operation.

Assume, for example, that memory cell 32a is presently in the "zero" state (transistor Q39 ON, and transistor Q40 OFF). Assume, further, that the state of the memory cell is to be reversed with transistor Q40 ON and transistor Q39 OFF. Accordingly, the voltage supplied on the word line 35 is raised as represented by waveform 46, the voltage supplied on bit line 36 is raised as represented by waveform 47, and the voltage supplied on the opposite bit line is held at a low level as illustrated by waveform 48. The resulting current supplied current supplied on the bit line 36 is represented by the waveform 49. That is, between the times $t_1$ and $t_2$ the contents of the memory cell 32a are being read and current is supplied on the bit line 36 to indicate that transistor Q39 is ON (the memory cell 32 is in a "zero" state). The current supplied from the memory cell to bit line 37 between the times $t_1$ and $t_2$ is illustrated by the waveform 50. Between the times $t_2$ and $t_3$, that is when the voltage supplied on the bit line 36 rises as indicated by waveform 47, transistors Q33 and Q39 are turned OFF and transistor Q40 is turned ON by the collector current of Q34. Accordingly, the current supplied on the bit line 36 drops to a low level as indicated by the waveform 49 between the times $t_2$ and $t_3$. Likewise, the current supplied on the bit line 37 between the times $t_2$ and $t_3$ increases in magnitude as a result of the transistor Q40 turning ON. After the voltage supplied on the bit line 36 drops back to a low level at time $t_3$, the current from the bit line 36 rises to a nominal value corresponding to the base current of Q33 and the current on bit line 37 increases by an amount corresponding to the collector current of Q33. The current supplied on the bit line 37 exceeds the amount of current supplied on the bit line 36 as a result of the memory cell 32 changing from a "zero" state to a "one" state.

It is necessary to be able to write into a single addressed cell in a column, such as cell 32a (FIG. 4), and not into other cells in the same column, such as cell 32c, at a given time. Thus, the information supplied on the bit lines 36 and 37 to write into cell 32a must not also be written into the unaddressed cell 32c. To better understand how this is accomplished in the present invention, reference is made to a schematic diagram of cells 32a and 32c in FIG. 7, and to the timing diagram shown in FIG. 8.

Cells 32a and 32b are illustrated by reference corresponding to the schematic diagram of FIG. 3 and described above, which reference numerals include the prefix "1", and the suffix "a" for cell 32a and "c" for cell 32c. In addition, nodes 155a, 155c, 156a and 156c are identified at the base of transistors Q139a, Q139c, Q140a, and Q140c, respectively. Parasitic capacitances resulting from the integrated circuit of the present invention are formed between the base and emitter of transistors Q139a, 139c, 140a, and 140c, and between the base and collector of these same transistors. In particular, capacitor C10 is coupled between the emitter of transistor Q139a and the base of terminal thereof at node 155a. Capacitor C11 is coupled between the emitter of Q140a and the base terminal thereof at node 156a. Capacitor C12 is coupled between the nodes 155a and 156a, and represents the combined base-to-collector parasitic capacitance of integrated transistors Q139a and Q140a. In a similar manner, capacitors C13, C14 and C15 are coupled to nodes 155c and 156c in cell 32c.

Referring to FIG. 8, a timing diagram of the operation of the cells illustrated in FIG. 7 is shown. Waveform 60 represents the voltage supplied on the bit line 136 during a write operation, and waveform 61 represents the voltage supplied on the bit line 137. Waveform 62 represents the voltage on node 155a, and waveform 63 represents the voltage on node 156a during the write operation. Waveform 64 represents the voltage on node 155c, and waveform 65 represents the voltage on node 156c during the write operation.

Assume, for example, that transistor Q139a is initially ON and that it is desired to turn Q140a ON in cell 32a without affecting the state of cell 32c. When the voltage on bit line 136 (waveform 60) goes positive, transistors Q133a and Q139a are turned OFF in cell 32a, and transistors Q133c and Q139c are turned OFF in cell 32c. During the time that the input voltage on bit line 136 (waveform 60, FIG. 8) is rising (time $t_1$ to $t_2$), the voltage on node 155a also rises as a result of the capacitive coupling through capacitor C10. This rise in voltage on node 155a is represented by waveform 62 during this time interval. The voltage on node 156a also rises during this time interval as represented by waveform 63.

During the time between $t_2$ and $t_3$ the voltage on node 156a continues to increase as a result of transistor Q134a being ON and transistor Q139a being OFF. The collector current from transistor Q134a changes the voltage on node 156a, as represented by the change in slope of waveform 63 during this time interval. When the voltage on node 156a reaches a threshold point (waveform 63 at time $t_3$) transistor Q140a turns ON and the voltage on node 155a drops to a low level (waveform 62 from time $t_3+$ through time $t_5$).

In the unaddressed cell 32c, the transistors Q133c and Q139c are also turned OFF, and the voltage on nodes 155c and 156c (waveforms 64 and 65) are the same as the voltages on the nodes 155a and 156a between times $t_1$ and $t_2$. However, between times $t_2$ and $t_3$, the collector current from transistor Q134c is much smaller than the collector current from the transistor Q134a. Therefore, the voltage rate of change on node 156c is substantially less than that on node 156a, and as a result transistor Q140c is not turned ON. It is noted that the slope of waveforms 64 and 65 between times $t_2$ and $t_4$ are exaggerated in the drawing for clarification purposes only. In actuality the voltage rate of change depicted by these waveforms is extremely small.

In the addressed cell 32a, since the transistor Q140a was turned ON at time $t_3$, transistor Q139a does not turn back ON, and thus the state of the cell has been changed. However, in the unaddressed cell 32c, the voltage on node 155c is still more positive than the voltage on node 156c, and transistor Q139c therefore turns ON during the fall time of the write pulse (waveform 60, time $t_4$ to $t_5$). Accordingly, the state of the unaddressed cell 32a remains unchanged.

As stated hereinabove, there is a restraint on the possible length of the wire pulse. This may be seen by comparing waveform 64 with waveform 60. If the positive portion of waveform 60 (the write pulse) were sufficiently long to allow the voltage on node 156c to